(12) United States Patent
Cheng et al.

(10) Patent No.: US 9,455,352 B2
(45) Date of Patent: Sep. 27, 2016

(54) HTO OFFSET FOR LONG LEFFECTIVE, BETTER DEVICE PERFORMANCE

(71) Applicant: Cypress Semiconductor Corporation, San Jose, CA (US)

(72) Inventors: Ning Cheng, Cupertino, CA (US); Huaqiang Wu, Burlingame, CA (US); Hiro Kinoshita, Sunnyvale, CA (US); Jihwan Choi, San Mateo, CA (US); Angela Hui, Milpitas, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/109,157

(22) Filed: Dec. 17, 2013

(65) Prior Publication Data

US 2014/0167138 A1 Jun. 19, 2014

Related U.S. Application Data

(63) Continuation of application No. 12/342,016, filed on Dec. 22, 2008, now Pat. No. 8,653,581.

(51) Int. Cl.
| | |
|---|---|
| *H01L 27/115* | (2006.01) |
| *H01L 29/792* | (2006.01) |
| *G11C 16/34* | (2006.01) |
| *H01L 29/10* | (2006.01) |
| *H01L 29/66* | (2006.01) |
| *H01L 21/265* | (2006.01) |

(52) U.S. Cl.
CPC ......... *H01L 29/792* (2013.01); *G11C 16/3427* (2013.01); *H01L 27/11565* (2013.01); *H01L 27/11568* (2013.01); *H01L 29/1083* (2013.01); *H01L 29/66833* (2013.01); *H01L 29/7923* (2013.01); *H01L 21/26586* (2013.01)

(58) Field of Classification Search
CPC ............... G11C 16/3427; H01L 29/66833; H01L 27/115
USPC ................ 257/324, 390, E21.679, E27.081, 257/E27.103; 438/257, 261, 300, 301
See application file for complete search history.

(56) References Cited

U.S. PATENT DOCUMENTS

| | | | |
|---|---|---|---|
| 7,626,227 B2 | 12/2009 | Kouketsu et al. | |
| 8,486,782 B2 | 7/2013 | Cheng et al. | |
| 8,653,581 B2 | 2/2014 | Cheng et al. | |
| 2003/0062567 A1* | 4/2003 | Zheng et al. | 257/316 |
| 2007/0045720 A1* | 3/2007 | Kouketsu et al. | 257/324 |

(Continued)

OTHER PUBLICATIONS

Office Action for U.S. Appl. No. 12/342,016 Dated Apr. 26, 2011, 19 pgs.
Office Action for U.S. Appl. No. 12/342,016 Dated Jan. 14, 2011, 22 pgs.
Office Action for U.S. Appl. No. 12/342,016 Dated Sep. 27, 2010, 12 pgs.

(Continued)

*Primary Examiner* — Thomas L Dickey

(57) ABSTRACT

Memory devices having an increased effective channel length and/or improved TPD characteristics, and methods of making the memory devices are provided. The memory devices contain two or more memory cells on a semiconductor substrate and bit line dielectrics between the memory cells. The memory cell contains a charge trapping dielectric stack, a poly gate, a pair of pocket implant regions, and a pair of bit lines. The bit line can be formed by an implant process at a higher energy level and/or a higher concentration of dopants without suffering device short channel roll off issues because spacers at bit line sidewalls constrain the implant in narrower implant regions.

19 Claims, 8 Drawing Sheets

(56) References Cited

U.S. PATENT DOCUMENTS

2007/0159880 A1* 7/2007 Eitan .............................. 365/184
2008/0149989 A1* 6/2008 Cheng et al. ................. 257/316
2010/0155817 A1   6/2010 Cheng et al.

OTHER PUBLICATIONS

USPTO Notice of Allowance for U.S. Appl. No. 12/342,016 dated Oct. 8, 2013; 10 pages.

* cited by examiner

HTO OFFSET FOR LONG LEFFECTIVE, BETTER DEVICE PERFORMANCE

CROSS-REFERENCE TO RELATED APPLICATIONS

This application is a Continuation of U.S. patent application Ser. No. 12/342,016 filed Dec. 22, 2008, which is incorporated herein by reference.

TECHNICAL FIELD

Described are memory devices having an improved effective channel length (Leffective) and/or improved transport program disturb (TPD) characteristics, methods of forming memory devices, and methods of increasing an effective channel length in memory cells.

BACKGROUND

Modern computing devices utilize a variety of kinds of memory devices to store and access information. Memory devices include general classes of random access memories (RAM) and read only memories (ROM). These classes further contain static RAM (SRAM), dynamic RAM (DRAM), programmable ROM (PROM), electrically programmable ROM (EPROM), electrically erasable PROM (EEPROM), as well as FLASH memory, and the like. Most memory devices employ an internal architecture in the form of an array memory of bit cells, containing plural rows and plural intersecting columns.

A memory cell is placed at each intersecting row and column in the array. Typically, a particular memory cell is accessed by activating its row and then reading or writing the state of its column. Memory sizes are defined by the row and column architecture. For example, a 1024 row by 1024 column memory array defines a memory device having one megabit of memory cells. The array rows are referred to as word lines and the array columns are referred to as bit lines.

The trend in semiconductor memory devices has been toward higher circuit density with higher numbers of bit cells per device, lower operating voltages, and higher access speeds. To achieve the high densities there have been, and continue to be, efforts toward scaling down device dimensions (e.g., at sub-micron levels). However, as scaling down device dimensions, hot electrons generated during programming a memory cell may reach adjacent memory cells and disturb programming the adjacent memory cells (e.g., TPD). Thus, the requirement of small features with close spacing between adjacent features requires sophisticated manufacturing techniques without suffering an effective channel length.

SUMMARY

The following presents a simplified summary of the innovation disclosed herein in order to provide a basic understanding of some aspects of the innovation. This summary is not an extensive overview of the innovation. It is intended to neither identify key or critical elements of the innovation nor delineate the scope of the innovation. Its sole purpose is to present some concepts of the innovation in a simplified form as a prelude to the more detailed description that is presented later.

One aspect of the subject innovation provides methods of making memory devices. Another aspect of the subject innovation provides methods of increasing an effective channel length in memory cells. The methods can involve providing features and bit line openings therebetween on a semiconductor substrate and forming spacers adjacent side surfaces of the features and in the bit line openings. The methods can further involve forming bit lines in the semiconductor substrate under bit line openings. The bit line can be formed by an implant process using the spacers in the bit line opening as an implant screen. The spacer can be used to offset the implants.

The spacer can constrain the implant in a narrower implant region, thereby increasing an effective channel length of the memory cell. The spacers can also allow the bit line implant with higher energy and/or higher dose without suffering device short channel roll off issues. Higher energy bit line implant can form deeper bit line junction and can effectively block hot electron move to the adjacent memory cell and prevent TPD.

Yet another aspect of the subject innovation provides memory devices having an improved effective channel length and/or improved TPD characteristics. The memory devices contain two or more memory cells and bit line opening therebetween on a semiconductor substrate. The memory cell contains a charge trapping dielectric stack and a poly gate on the semiconductor substrate; two pocket implant regions adjacent and under the charge trapping dielectric stack in the semiconductor substrate; and two bit lines in the semiconductor substrate under the bit line openings. The bit line has a decreased lateral length, thereby increasing an effective channel length of the memory cell.

To the accomplishment of the foregoing and related ends, the innovation, then, comprises the features hereinafter fully described and particularly pointed out in the claims. The following description and the annexed drawings set forth in detail certain illustrative embodiments of the innovation. These embodiments are indicative, however, of but a few of the various ways in which the principles of the innovation may be employed. Other objects, advantages and novel features of the innovation will become apparent from the following detailed description of the innovation when considered in conjunction with the drawings.

DETAILED DESCRIPTION

Figure 1:
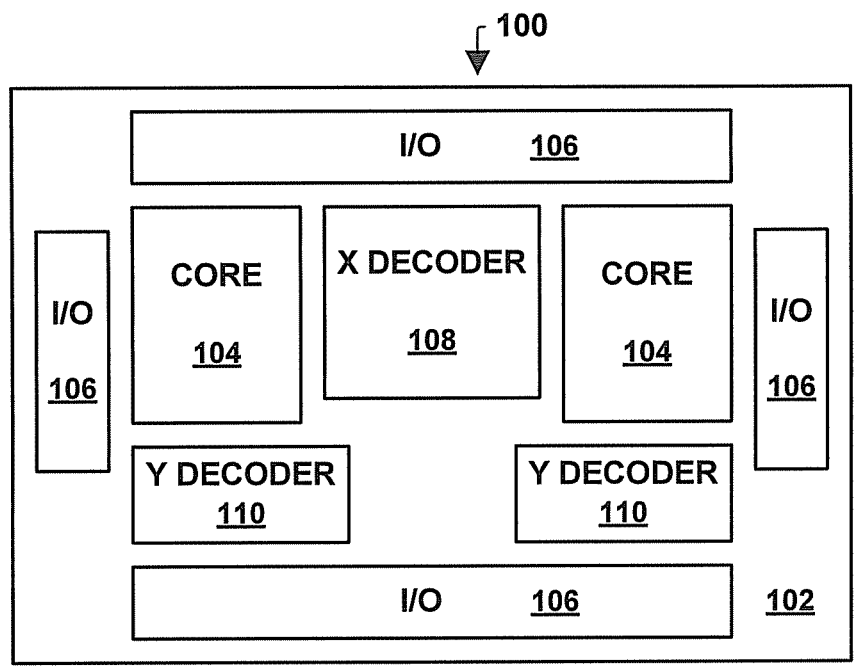
FIG. 1 is a top view of an exemplary memory device in accordance with an aspect of the subject innovation.

The device and method described herein can improve the scalability of, for example, a single-bit, double-bit, or multi-bit charge trapping dielectric flash memory device, by allowing for a greater effective channel length (Leffective). A greater effective channel length can provide improved charge separation in memory cells, a reduction in complementary bit disturb effects, as well as improved drain-source break down voltage (BVdss) characteristic. This greater effective channel length can be accomplished due to a decreased lateral dimension for a diffusion region of each bit line.

A memory cell is generally programmed by applying a relatively high voltage to a control gate and connecting a source to ground and a drain to a predetermined potential above the source. During the programming of memory cells, hot electrons in a core cell channel region tunnel through a gate oxide into the floating gate and become trapped in the floating gate since the floating gate is surrounded by an interpoly dielectric and the tunnel oxide. Because of the trapped electrons, the threshold voltage of the cell increases. This change in the threshold voltage (and thereby the channel conductance) of the cell created by the trapped electrons is what causes the cell to be programmed.

The hot electrons generated during programming may be so hot that they go under bit line junction. The hot electrons may reach floating gates or storage elements of adjacent memory cells. Moreover, hot holes generated during programming may have a secondary impact ionization below a bit line region and the secondary electrons diffuse to a gate of adjacent memory cell where they are accelerated by a drain depletion region and injected into a storage element of the adjacent memory cell. As a result, due to the hot electrons and hot holes generated during programming, memory cells may suffer from a TPD phenomenon.

With memory devices shrinking in size, shorter channel lengths of the smaller devices increasingly exhibit short channel behaviour that affects program operation. As the memory cells shrink, BVdss generally reduces, resulting in increased column leakage current originated from unselected wordline cells when the same programming voltage is applied at the selected bit line. The increased leakage current may load down the bit line driver and may increase power consumption. In a worst case, the intrinsic programming voltage may be pulled down and the program efficiency may be impaired.

The subject innovation provides memory devices, methods of forming memory devices, and methods of increasing an effective channel length in memory cells. The subject innovation can provide one or more of the following advantages: an increased effective channel length, improved TPD characteristics, and improved drain-source break down voltage (BVdss) characteristics.

An effective channel length of a memory cell is defined between corresponding pairs of buried bit lines. In the subject innovation, the bit lines are formed by implantation of dopants using spacers as an implant screen to offset the implants. The spacers constrain the implant in a narrower implant region, thereby increasing an effective channel length of the memory cell. The spacers can also allow the bit line implant with higher energy and/or higher dose without suffering device short channel roll off issues. Higher energy bit line implant can form a deeper bit line junction and can effectively block hot electron move to the adjacent memory cell and prevent TPD. The deeper bit line can also prevent and/or mitigate bitline-to-bitline current leakage and increase BVdss.

The subject innovation described herein can be applied to any suitable type of memory cell. For example, the subject innovation can be applied to single-level memory cells, multi-level memory cells, single-bit memory cells, dual-bit memory cells, quad-bit memory cells, multi-bit memory cells, and the like. The dual-bit memory is a relatively modern memory technology and allows multiple bits to be stored in a single memory cell. The dual-bit memory cell is essentially split into two identical (mirrored) parts, each of which is formulated for storing one of two independent bits. Each dual-bit memory cell, like a traditional cell, has a gate with a source and a drain. However, unlike a traditional stacked gate cell in which the source is always connected to an electrical source and the drain is always connected to an electrical drain, respective dual-bit memory cells can have the connections of the source and drain reversed during operation to permit storage of two bits.

A dual-bit memory cell can have a semiconductor substrate with implanted conductive bit lines. The dual-bit memory cell contains a charge trapping dielectric stack that can contain one or more layers and can be formed over the semiconductor substrate. For example, the charge trapping dielectric stack can contain three separate layers: a first insulating layer, a charge trapping dielectric layer, and a second insulating layer. Word lines are formed over the charge trapping dielectric stack substantially perpendicular to the bit lines. Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

The innovation is now described with reference to the drawings, wherein like reference numerals are used to refer to like elements throughout. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

Although the subject innovation can be applied to any type of memory cell, the innovation is hereinafter illustrated and described in the context of an exemplary semiconductor device having one or more memory arrays containing dual-bit memory cells arranged in a virtual ground type array architecture. FIG. 1 illustrates a top view of an exemplary dual-bit flash memory device 100. The memory device 100 generally includes a semiconductor substrate 102 in which one or more high-density core regions 104 and one or more lower-density peripheral portions are formed. The high-density core regions 104 typically include one or more M by N arrays of individually addressable, substantially identical dual-bit memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that cooperate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations). The memory device 100 contains memory cells that are described in detail below, for example, in FIGS. 4-12.

Figure 2:
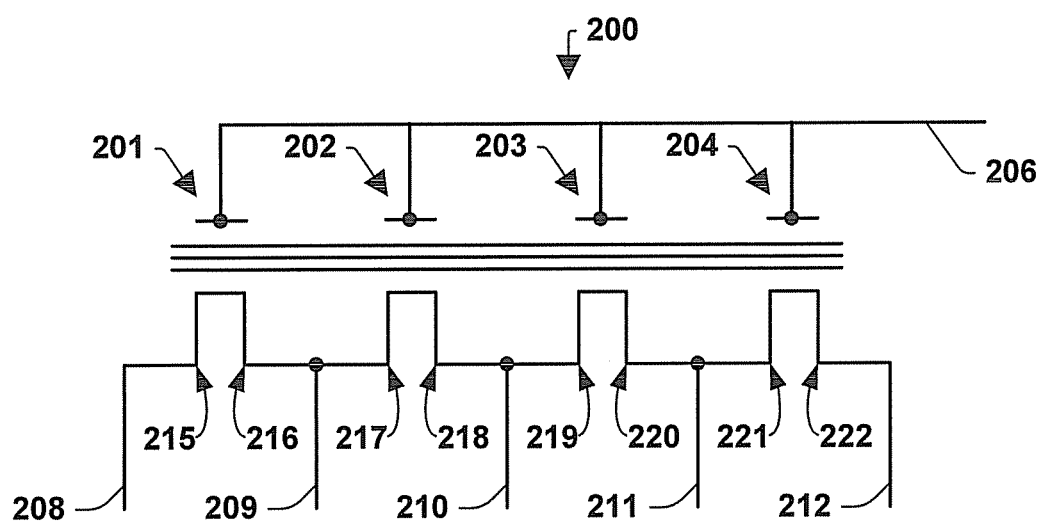
FIG. 2 is a schematic illustration of a portion of a memory core such as may include at least part of one of the cores depicted in FIG. 1 in a virtual ground type configuration in accordance with an aspect of the subject innovation.

FIG. 2 is a schematic illustration of a portion 200 of an exemplary memory core such as may include at least a part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a word line 206, which serves as a control gate, and pairs of the memory cells share a common bit line. For instance, in the example shown, the memory cell 201 associates bit lines 208 and 209; the memory cell 202 associates bit lines 209 and 210; the memory cell 203 associates bit lines 210 and 211; and the memory cell 204 associates bit lines 211 and 212. As such, cells 201 and 202 share bit line 209, cells 202 and 203 share bit line 210 and cells 203 and 204 share bit line 211, respectively. The memory cells 201 through 204 are described in detail below, for example, in FIGS. 4-12.

Depending upon a signal on the word line and the connection of the bit lines in a memory cell to an electrical source or drain, the memory cells 201 through 204 are capable of writing, reading, and erasing bits at locations 215 through 222. For example, control of the bit at location 215 is achieved through connection of the drain to the bit line 208 and the source to the bit line 209. Similarly, control of the bit at location 216 is achieved through connection of the drain to the bit line 209 and the source to the bit line 208. It will be appreciated that although adjacent memory cells share common bit lines, the adjacent memory cells do not interfere with each other because the memory cells are typically programmed one at a time and in such instances only one memory cell is active at a time while programming.

Figure 3:
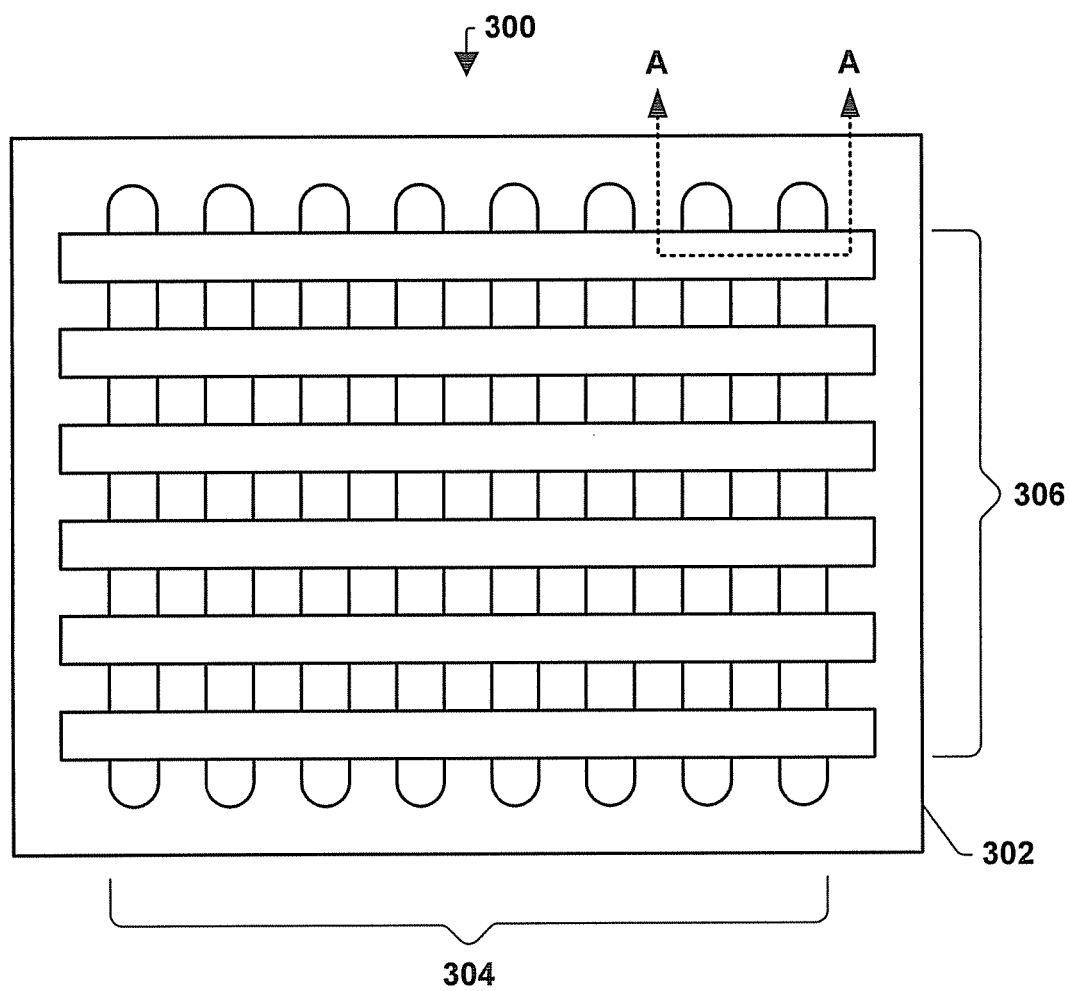
FIG. 3 is a top view of at least a portion of a memory core, such as may include at least a part of one of the cores depicted in FIG. 1 in accordance with an aspect of the subject innovation.

FIG. 3 illustrates a top view of at least a portion 300 of a memory core, such as may include at least part of one of the M by N array cores 104 depicted in FIG. 1. The memory 300 is formed upon a semiconductor substrate 302 and has a plurality of implanted bit lines 304 extending substantially parallel to one another, and further includes a plurality of formed word lines 306 extending substantially in parallel to one another and at substantially right angles to the plurality of implanted bit lines 304. It will be appreciated that the word lines 306 and bit lines 304 have contacts and interconnections (e.g., bit line junctions, not shown) to programming circuitry such as may be represented, at least in part, by x-decoders and y-decoders. The memory core 300 contains memory cells that are described in detail below, for example, in FIGS. 4-12.

Figure 4:
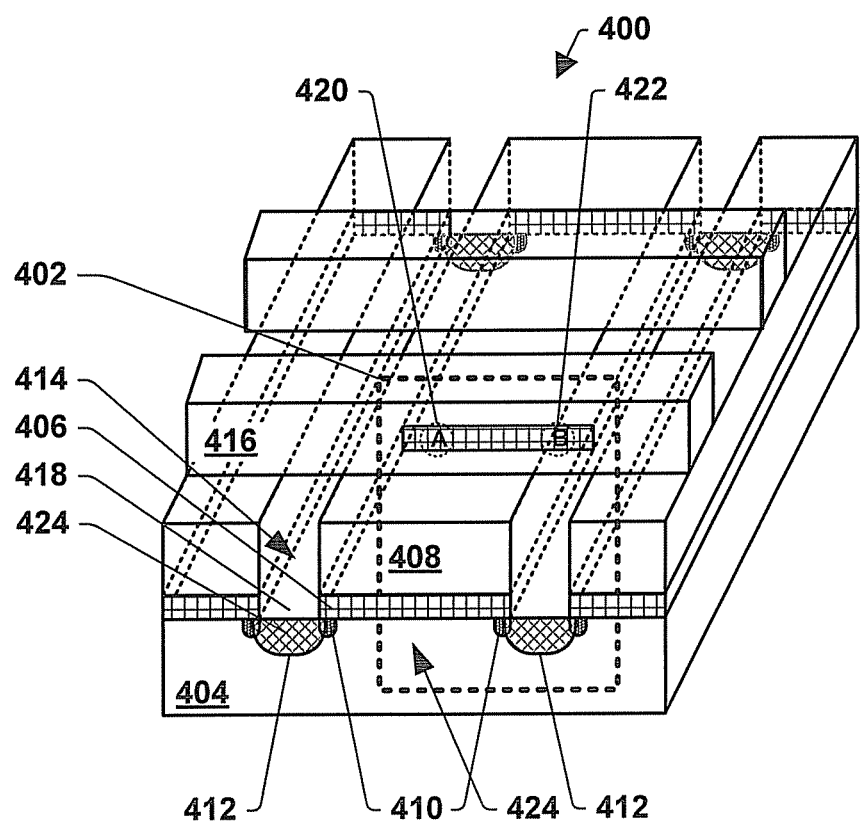
FIG. 4 is a cross-sectional isometric illustration of exemplary memory cells, such as that taken along a line A-A of FIG. 3 in accordance with an aspect of the subject innovation.

FIG. 4 is a cross-sectional isometric illustration of a portion of a memory device 400 containing a dual-bit memory cell 402 as indicated by a dashed line, such as that taken along a line A-A of FIG. 3. The dual-bit memory cell 402 is formed on a semiconductor substrate 404. The memory cell 402 contains a charge trapping dielectric stack 406; a poly gate 408 on the charge trapping dielectric stack 406; two pocket implant regions 410 adjacent and under the charge trapping dielectric stack 406 in the semiconductor substrate; bit lines 412 in the semiconductor substrate 404 adjacent the charge trapping dielectric stack 406 and under bit line openings 414; and a word line 416. The memory cell 402 is separated from adjacent memory cells by bit line dielectrics 418 in bit line openings 414. The bit line dielectric 418 can contain any suitable dielectric material such as oxides (e.g., silicon oxide, high temperature oxide (HTO), high density plasma (HDP) oxide). In one embodiment, the bit line dielectric does not extend into the semiconductor substrate.

The charge trapping dielectric stack 406 can contain two charge storage nodes that can store at least a bit of information, respectively. For example, the memory cell 402 is capable of storing two spatially separated binary data bits, including a left bit 420 represented by the dashed circle A and a right bit 422 represented by the dashed circle B. When the memory cell 402 is such a dual-bit memory cell, the dual-bit memory cell is generally symmetrical, wherein a drain and a source are interchangeable, although asymmetric implementations are possible within the scope of the innovation. In one embodiment, the two charge storage nodes 420, 422 are physically separated by a central dielectric (not shown) in the charge trapping dielectric stack 406. In another embodiment, the two charge storage nodes are not physically separated in a single charge trapping dielectric stack.

The bit lines 412 typically contain implanted n-type materials, such as arsenic, and may include an oxide portion (not shown) in some examples. The two bit lines 412 are spaced apart and define a channel region 424 therebetween. The channel 424 can have an effective channel length and the bits 420, 422 can be stored apart from each other in the charge trapping dielectric stack 406.

In the exemplary memory cell 402, the left bit line 412 may serve as the source terminal and the right bit line 412 as the drain terminal with respect to the right bit 420. Likewise, the right bit line 412 may serve as the source terminal and the left bit line 412 as the drain terminal for the left bit 418. The subject innovation may be implemented in association with various single or multi-bit memory cell types including a SONOS cell. In addition, the innovation is applicable to such dual-bit memory devices wherein both bits are used for data or information storage, as well as those in which only one bit (e.g., bit A or bit B) of the dual-bit cell is so used.

Since the memory cell 402 has the two charge storage nodes 420, 422, the memory cell 402 can store two physically distinct bits. Each bit within the memory cell 402 serves as a binary unit of data (e.g., either 1 or 0) that can be mapped directly to a memory array. Reading or programming one side of charge storage nodes 420, 422 can occur independently of whatever data is stored on the opposite side of the charge storage nodes 420, 422.

The memory device 400 can contain word lines 416 over the charge trapping dielectric stack 406. Any number of such word lines can be formed over the charge trapping dielectric stack 406 and such word lines may correspond to the word lines 306 depicted in FIG. 3. The word lines can contain a polysilicon material, for example, where the polysilicon material may be deposited over the charge trapping dielectric stack 406 and then patterned and etched.

Figure 5:
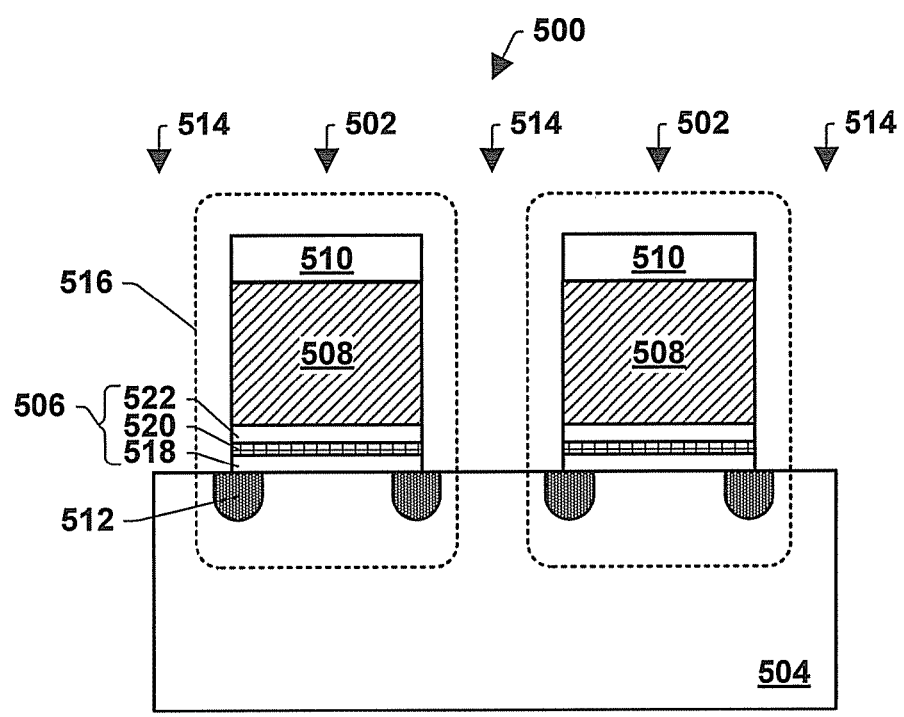
FIGS. 5-10 illustrate an exemplary method for making a memory device in accordance with an aspect of the subject innovation.

Referring to FIGS. 5 to 10, one of many possible exemplary embodiments of forming memory devices is specifically illustrated. FIG. 5 illustrates a cross sectional view of an intermediate state of a portion of an exemplary memory device 500. The memory device 500 can contain one or more features 502 on a semiconductor substrate 504. The features 502 can contain a charge trapping dielectric stack 506, a poly layer 508, a first mask layer 510, and two pocket implant regions 512 adjacent and under the charge trapping dielectric stack in the semiconductor substrate 504.

The memory device 500 has bit line openings 514 between the features 502. A memory cell is formed in the subsequent processes at a position indicated by a dashed line 516. For simplicity of illustration in FIG. 5, two features 502 and three bit line openings 514 are shown. However, the memory device 500 can have any suitable number of features and bit line openings. For example, the memory device 500 can have a M×N array of features 502 with M rows and N columns.

The semiconductor substrate 504 may contain any suitable semiconductor material on which electric devices such as memory cell transistors can be formed. Examples of semiconductor materials include silicon, gallium arsenide, indium phosphide, and the like.

The charge trapping dielectric stack 506 is formed over the semiconductor substrate 504. The configuration and/or constituent of the charge trapping dielectric stack 506 may vary and are not critical to the subject innovation. For example, the charge trapping dielectric stack can contain a central dielectric to contain physically separated two charge storage nodes (not shown). In another embodiment, the two charge storage nodes are not physically separated in a charge trapping dielectric stack.

Further, the charge trapping dielectric stack 506 can contain any suitable number of layers. For purposes of this discussion, the charge trapping dielectric stack 506 is described below in terms of three separate layers. However, it is to be appreciated that the charge trapping dielectric stack can include greater than or fewer than three dielectric or non-conductive layers without departing from the scope of the subject innovation.

The exemplary charge trapping dielectric stack 506 contains three separate layers: a first insulating layer 518, a charge trapping dielectric layer 520, and a second insulating layer 522. The charge trapping dielectric layer can contain any suitable dielectric material as long as the material can trap charges. Examples of charge trapping dielectric materials include nitrides (e.g., silicon nitride, silicon oxynitride, and silicon rich nitride), oxides, silicates, a high-k dielectric, for example, having a dielectric constant higher than that of silicon dioxide ($SiO_2$), and the like. In one embodiment, the charge trapping dielectric material contains silicon nitride, silicon oxynitride, and/or silicon rich nitride. In another example, the charge trapping dielectric material contains oxides or silicates containing Al, Ta, Hf, La, Zr, Ti, Nb, Cr, V, Y, Ce, and/or Pr.

The first and second insulating layers 518 and 522 typically contain oxide dielectrics such as silicon dioxide ($SiO_2$) and the charge trapping dielectric layer 520 typically contains nitride dielectrics such as silicon nitride ($Si_xN_y$). The oxide-nitride-oxide configuration may be referred to as an ONO layer. Especially, when the nitride layer contains silicon rich nitride, the first oxide layer, nitride layer, and second oxide layer may be referred to as an ORO tri-layer.

Specific examples of other charge trapping dielectric stacks include an oxide/nitride bi-layer, a nitride/oxide bi-layer, an oxide/tantalum oxide bi-layer ($SiO_2/Ta_2O_5$), an oxide/tantalum oxide/oxide tri-layer ($SiO_2/Ta_2O_5/SiO_2$), an oxide/strontium titanate bi-layer ($SiO_2/SrTiO_3$), an oxide/barium strontium titanate bi-layer ($SiO_2/BaSrTiO_2$), an oxide/strontium titanate/oxide tri-layer ($SiO_2/SrTiO_3/SiO_2$), an oxide/strontium titanate/barium strontium titanate tri-layer ($SiO_2/SrTiO_3/BaSrTiO_2$), and the like. In another embodiment, the charge trapping dielectric stack can contain five separate layers, for example, oxide-nitride-polysilicon-nitride-oxide. The oxide-nitride-polysilicon-nitride-oxide configuration may be referred to as an ORPRO layer when the nitride layer contains silicon rich nitride.

The charge trapping dielectric stack 506 can be formed by any suitable technique. For example, the charge trapping dielectric stack 506 can be formed by CVD, lithography, and etching techniques. The oxide-nitride-oxide tri-layer can be fabricated by forming a first silicon oxide layer, forming a silicon nitride layer on the first silicon oxide layer, and forming a second silicon oxide layer on the silicon nitride layer. The first oxide layer can be formed on surfaces of the semiconductor substrate 504 by, for example, oxidation techniques (e.g., thermal oxidation, plasma-assisted oxidation, and the like) and/or deposition techniques (e.g., CVD, spin-on techniques, and the like). A nitride layer is formed on the first oxide layer by, for example, deposition techniques (e.g., CVD, spin-on techniques, and the like). The second oxide layer can be formed in the same manner as the first oxide layer.

The heights of the first oxide layer 518 and second oxide layer 522 may vary and are not critical to the subject innovation. The first oxide layer and second oxide layer have independently any suitable height that depends on the desired implementations of the semiconductor structure 500 being fabricated. In one embodiment, the heights of the first oxide layer and second oxide layer are independently about 1 nm or more and about 10 nm or less. In another embodiment, the heights of the first oxide layer and second oxide layer are independently about 2 nm or more and about 8 nm or less. In yet another embodiment, the heights of the first oxide layer and second oxide layer are independently about 3 nm or more and about 7 nm or less. In still yet another embodiment, the heights of the first oxide layer and second oxide layer are about 5 nm.

The height of the nitride layer 520 may vary and is not critical to the subject innovation. The nitride layer has any suitable height that depends on the desired implementations of the semiconductor structure 500 being fabricated. In one embodiment, the height of the nitride layer is about 1 nm or more and about 20 nm or less. In another embodiment, the height of the nitride layer is about 2 nm or more and about 15 nm or less. In yet another embodiment, the height of the nitride layer is about 3 nm or more and about 10 nm or less. In still yet another embodiment, the height of the nitride layer is about 7 nm.

The poly layer 508 typically contains polysilicon. The height of the poly layer 508 may vary and is not critical to the subject innovation. The poly layer 508 has any suitable height that depends on the desired implementations of the semiconductor structure 500 being fabricated. In one embodiment, the height of the poly layer 508 is about 30 nm or more and about 300 nm or less. In another embodiment, the height of the poly layer 508 is about 50 nm or more and about 200 nm or less. In yet another embodiment, the height of the poly layer 508 is about 70 nm or more and about 150 nm or less. In still yet another embodiment, the height of the poly layer 508 is about 100 nm.

The first mask layer 510 may contain any suitable mask material. Examples of mask materials include oxides such as silicon oxide (e.g., silicon oxide ($Si_xO_y$) and silicon dioxide ($SiO_2$); nitrides such as silicon nitride (e.g., silicon nitride ($Si_xN_y$), silicon rich nitride, and oxygen rich silicon nitride); and the like.

The height of the first mask layer 510 may vary and is not critical to the subject innovation. The first mask layer 510 has any suitable height that depends on the desired implementations of the semiconductor structure 500 being fabricated. In one embodiment, the height of the first mask layer 510 is about 10 nm or more and about 200 nm or less. In another embodiment, the height of the first mask layer 510 is about 20 nm or more and about 150 nm or less. In yet another embodiment, the height of the first mask layer 510 is about 30 nm or more and about 100 nm or less. In still yet another embodiment, the height of the first mask layer 510 is about 60 nm.

Although not shown, an anti-reflective coating (ARC) can be formed on the first mask layer 510 for increasing resolution of a subsequent lithography process. Any suitable ARC material can be employed. For example, ARC contains oxides such as silicon oxide; nitrides such as silicon nitride; carbides such as silicon carbide ($Si_xC_y$); amorphous carbon; and the like.

The features 502 can be formed on the semiconductor substrate by any suitable technique. For example, a charge trapping dielectric stack is formed on a semiconductor substrate, a poly layer is formed on the charge trapping dielectric stack, and a first mask layer is formed on the poly layer. The first mask layer is patterned by removing portions of the first mask layer via, for example, lithography and etching techniques, thereby forming a patterned first mask layer 510 and exposing portions of the poly layer and the charge trapping dielectric stack. The poly layer and the charge trapping dielectric stack are patterned by removing the exposed portions of the poly layer and the charge trapping dielectric stack that are not covered with the patterned first mask layer, thereby forming the patterned poly layer 508 and the patterned charge trapping dielectric stack 506.

The pocket implant regions 512 typically contain an implanted p-type material, such as boron. The pocket implant regions can facilitate controlling a threshold voltage of the memory cell. The pocket implant regions 512 can be formed in the semiconductor substrate 504 by any suitable technique. For example, the pocket implant region 512 is formed via implantation of one or more dopants at an angle with respect to the surface of the semiconductor substrate 504. The dopants pass through the bit line opening 514 and are implanted adjacent to and to a certain degree under portions of the charge trapping dielectric stack 508 depending upon the angle of implantation. The dopants can be implanted at an angle of about 5 degrees or more and about 40 degrees or less relative to the surface of the semiconductor substrate 504. Passing the dopants through the bit line opening between the features with a certain degree, the resultant pocket implant regions are located in the semiconductor substrate under the side surfaces of the features.

Any suitable implant compositions and concentrations for the pocket implants can be employed. For example, the dopants include one or more p-type dopants, such as boron. Such dopants can be implanted at an energy level of about 3 KeV or more and about 30 KeV or less and a dose of about 1E12 atoms/cm$^2$ or more and 5E15 atoms/cm$^2$ or less, for example.

While FIG. 5 illustrate the exemplary method of forming features on a semiconductor substrate, the details of the structure and manufacture of the features are not critical to the subject innovation. The details of the structure and manufacture of the features can be found in, for example, commonly-assigned U.S. Pat. No. 7,157,335, issued Jan. 2, 2007, which is hereby incorporated by reference.

Figure 6:
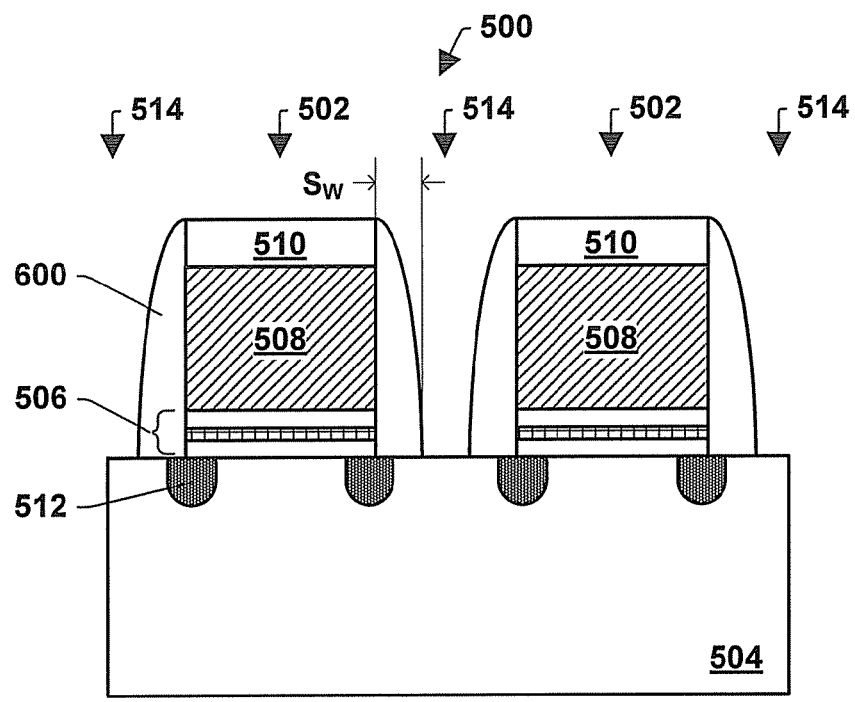

FIG. 6 illustrates forming spacers 600 adjacent the side surface of the feature 502 (e.g., the first mask 510, the poly gate 508, and the charge trapping dielectric stack 506) and on the upper surface of the semiconductor substrate 504 in the bit line opening 514. The spacer 600 can serve as an implant screen when forming bit lines in subsequent processes. After forming the two spacers 600 adjacent side surfaces of the features 502, a portion of the upper surface of the semiconductor substrate 504 that is not covered by the spacers 600 is exposed in the bit line opening 514.

The spacer 600 can contain any suitable material so that the spacer 600 can serve as an implant screen when forming bit lines in subsequent processes. The spacer material can be selected so that there is etch selectivity between the spacer 600 and other components of the memory device 500. When the spacer 600 is removed from the memory device 500, the spacer material is selected so that there is etch selectivity between the spacer 600 and the semiconductor substrate 504, for example. The spacer material can have a lower etch rate than the semiconductor substrate 504 in a subsequent etching process. For example, an etching rate of an oxide material is markedly slower than an etching rate of a silicon material with respect to a silicon etchant. Accordingly, in one embodiment, the spacer 600 contains an oxide material. Examples of oxides include silicon oxide, tetraethylorthosilicate (TEOS) oxide, high aspect ratio plasma (HARP) oxide, HTO, HDP oxide, oxides (e.g., silicon oxides) formed by an atomic layer deposition (ALD) process, and the like. Other examples of spacer materials include nitrides (e.g., silicon nitride, silicon oxynitride, and silicon rich silicon nitride), silicates, diamond-like carbon, carbide, and the like.

The spacer 600 can be formed by any suitable technique, for example, forming a layer containing the spacer material over the semiconductor substrate 504 and then removing portions of the spacer material layer not near the side surface of the feature 502. The spacer material layer can be formed at least over the side surface of the feature 502.

In one embodiment, the spacer material layer is formed by a HTO process. For example, the HTO is formed by low pressure chemical vapor deposition (LPCVD) using nitrous oxide ($N_2O$) and dichlorosilane ($SiH_2Cl_2$) gasses at a temperature of about 600 degrees Celsius or more and about 900 degrees Celsius or less and a pressure of about 100 mTorr or more and about 500 mTorr or less. In another embodiment, the spacer material layer is grown in plasma at low temperatures, e.g., plasma-grown oxide. For example, the spacer material layer contains plasma-grown oxide that is grown at a temperature of about 250 degrees Celsius or more and about 600 degrees Celsius or less. The spacer material layer can be formed by a HDP process. The spacer material layer can be optionally subjected to an anneal, for example, in a nitrogen ambient at about 1,000 degrees Celsius for thirty minutes.

After forming the spacer material layer, portions of the spacer material layer can be removed, for example, etching. Any suitable etching can be used as long as the etching can leave a spacer 600 adjacent the side surface of the feature 502 and on the semiconductor substrate 504. Examples of etching include reactive ion etching, chemical plasma etching, or other suitable anisotropic etching utilizing a suitable chemistry.

Choice of a suitable process and reagents of etching depends on, for example, the spacer material, the width and length of the spacer material, the desired implementations of the memory device 500 being fabricated, and the like. In one embodiment, reactive ion etching is used with an appropriate etchant for the selected spacer material. For example, when the spacer 600 contains silicon oxides or silicon nitrides, examples of etchants include $CF_4$ or $CHF_3$. In another embodiment, when the spacer 600 contains diamond-like carbon, examples of etchants include oxygen-based plasma. In yet another embodiment, when the spacer 600 contains silicon carbide, examples of etchants include $CF_4$, $CH_2F_2$, or $C_2F_6$.

The spacer 600 can have any suitable length ($SP_L$) that depends on, for example, the desired length of the subsequently formed bit line, the desired implementations of the memory device 500 being fabricated, and the like. Since the spacer 600 can serve as an implant screen, the length of the spacer 600 can control and/or determine a length of a bit line that is formed in the semiconductor substrate 504 in a subsequent process as described below. In one embodiment, the spacer 600 has a length of about 1 nm or more and about 50 nm or less. In another embodiment, the spacer 600 has a length of about 5 nm or more and about 40 nm or less. In yet another embodiment, the spacer 600 has a length of about 10 nm or more and about 30 nm or less.

Figure 7:
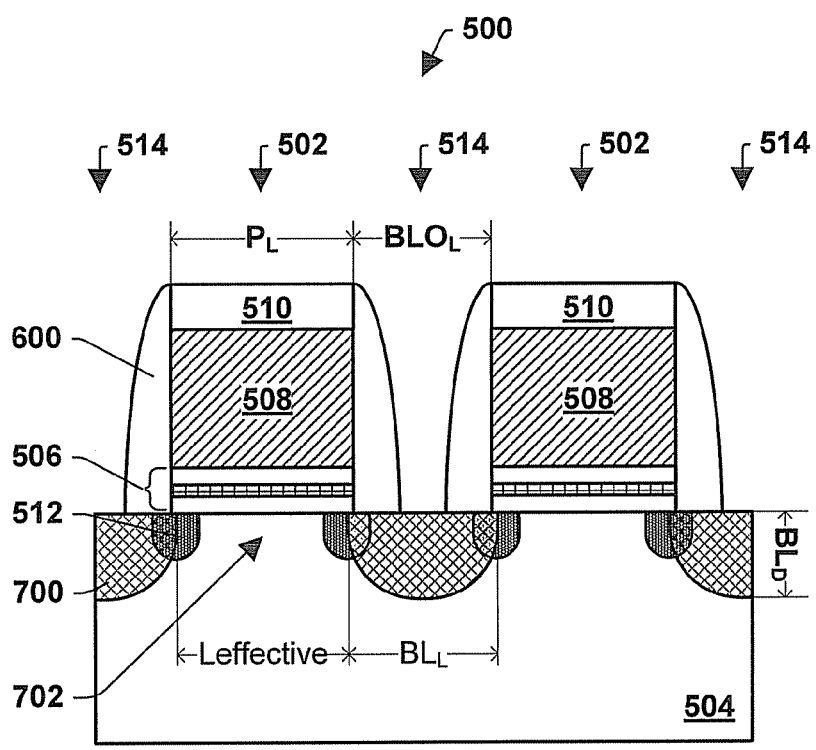

FIG. 7 illustrates forming bit lines 700 in the semiconductor substrate 504 under the bit line openings 514 adjacent the charge trapping dielectric stack 506. The buried bit lines can act as respective sources and drains for corresponding memory cells. As such, respective effective channel lengths are defined between corresponding pairs of buried bit lines 700.

Any suitable implant compositions and concentrations can be employed for the bit lines 700. For example, the bit lines 700 include one or more n-type dopants (e.g., arsenic, phosphorous, antimony). The bit lines 700 can be formed by any suitable technique. The bit line 700 can be formed by implantation of one or more dopants. The dopants pass through the bit line opening 700 between the spacers 600 and are implanted into the semiconductor substrate 504 under the bit line opening 700, leaving a channel region 702 of the semiconductor substrate 504 between the bit lines 700. The first mask layer 510 and the spacer 600 can serve as an implant screen. That is, the spacer is used to offset the implants and the spacer can constrain the implant in a narrower implant region. As a result, the memory cell can advantageously have a decreased bit line length and an increased effective channel length.

In one embodiment, the bit line length ($BL_L$) is about 70% or more and about 140% or less of the length of the bit line opening ($BLO_L$). In another embodiment, the bit line length ($BL_L$) is about 70% or more and about 120% or less of the length of the bit line opening ($BLO_L$). In yet another embodiment, the bit line length ($BL_L$) is about 70% or more and about 110% or less of the length of the bit line opening ($BLO_L$). In still yet another embodiment, the bit line length ($BL_L$) is about 70% or more and about 100% or less of the length of the bit line opening ($BLO_L$).

In one embodiment, the effective channel length is about 70% or more and about 100% or less of the length of the poly gate ($PG_L$). In another embodiment, the effective channel length is about 80% or more and about 100% or less of the length of the poly gate ($PG_L$). In yet another embodiment, the effective channel length is about 90% or more and about 100% or less of the length of the poly gate ($PG_L$). In still yet another embodiment, the effective channel length is about 95% or more and about 100% or less of the length of the poly gate ($PG_L$).

The spacers 600 can allow the bit line implant with higher energy and/or higher dose without suffering device short channel roll off issues. This is because the spacer at the bit line sidewall can constrain the implant in a narrower implant region. The spacer can tolerate higher energy bit line implant (which usually have high implant strangle) without leading to too wide bit line and device short channel effect. Higher energy bit line implant can form deeper bit line junction and can effectively block the hot electron move to the adjacent cell and prevent TPD.

The bit line 700 can be formed at a relatively higher energy level and/or a relatively higher dose of dopants. In one embodiment, the bit line 700 is formed at an energy level of about 5 KeV or more and about 100 KeV or less and a dose of about 2E13 atoms/cm$^2$ or more and about 4E15 atoms/cm$^2$ or less. In another embodiment, the bit line 700 is formed at an energy level of about 10 KeV or more and about 100 KeV or less and a dose of about 5E13 atoms/cm$^2$ or more and about 4E15 atoms/cm$^2$ or less. In yet another embodiment, the bit line 700 is formed at an energy level of about 20 KeV or more and about 100 KeV or less and a dose of about 1E14 atoms/cm$^2$ or more and about 4E15 atoms/cm$^2$ or less.

The resultant bit line 700 can have a higher concentration of dopants because of the higher energy and/or higher dose implant. In one embodiment, the bit line 700 has a concentration of dopants of about 5E17 atoms/cm$^3$ or more and about 1E21 atoms/cm$^3$ or less. In another embodiment, the bit line 700 has a concentration of dopants of about 1E18 atoms/cm$^3$ or more and about 1E21 atoms/cm$^3$ or less. In yet another embodiment, the bit line 700 has a concentration of dopants of about 5E18 atoms/cm$^3$ or more and about 1E21 atoms/cm$^3$ or less.

The bit line 700 can have an increased depth because of the higher energy and/or higher dose implant. In one embodiment, the bit line 700 has a depth ($BL_D$) of about 20 nm or more and about 300 nm or less. In another embodiment, the bit line 700 has a depth of about 30 nm or more and about 250 nm or less. In yet another embodiment, the bit line 700 has a depth of about 40 nm or more and about 200 nm or less.

A portion of the resultant bit line 700 can overlap with a portion of the pocket implant region 512. For example, an upper portion of the bit line adjacent to the charge trapping dielectric stack 506 overlaps with a portion of the pocket implant region. In one embodiment, at least about 20% of the area of the pocket implant region overlap with the bit line. In another embodiment, at least about 30% of the area of the pocket implant region overlap with the bit line. In yet another embodiment, at least about 40% of the area of the pocket implant region overlap with the bit line.

Figure 8:
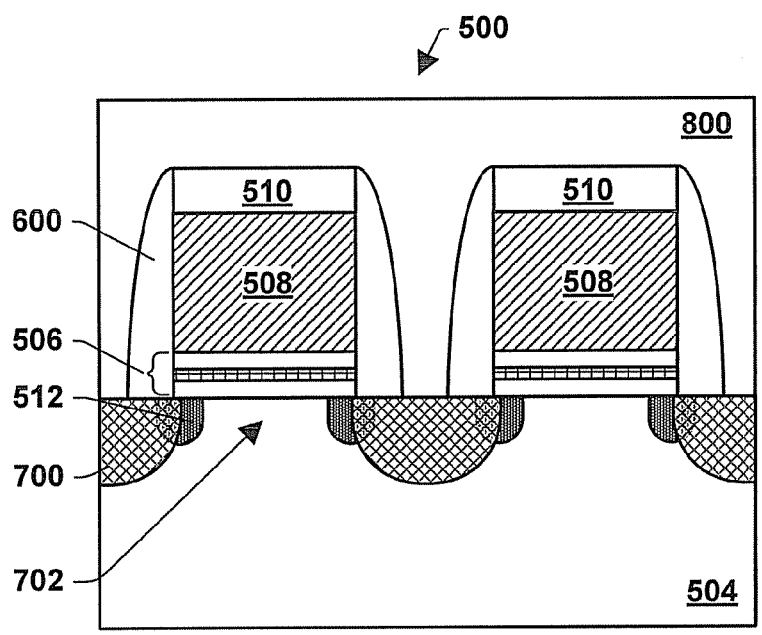

FIG. 8 illustrates forming a bit line dielectric layer 800 over the semiconductor substrate 504. The bit line dielectric layer 800 can contain any suitable dielectric material such as oxides. Examples of oxides include silicon oxide, TEOS oxide, HARP oxide, HTO, HDP oxide, ALD oxide, and the like. In one embodiment, the bit line dielectric layer contains the same material as the spacer 600.

The spacer 600 may or may not be removed before forming a bit line dielectric layer 800. In one embodiment, the spacer is not removed before forming the bit line dielectric layer. When the spacer is not removed, the bit line opening 700 contains at least a portion of the spacer 600. In another embodiment, the spacer 600 is removed before forming a bit line dielectric layer (not shown). When the spacer is removed, the bit line opening does not contain spacers. The spacer 600 can be removed by any suitable technique. For example, the spacer 600 is removed by etching.

Figure 9:
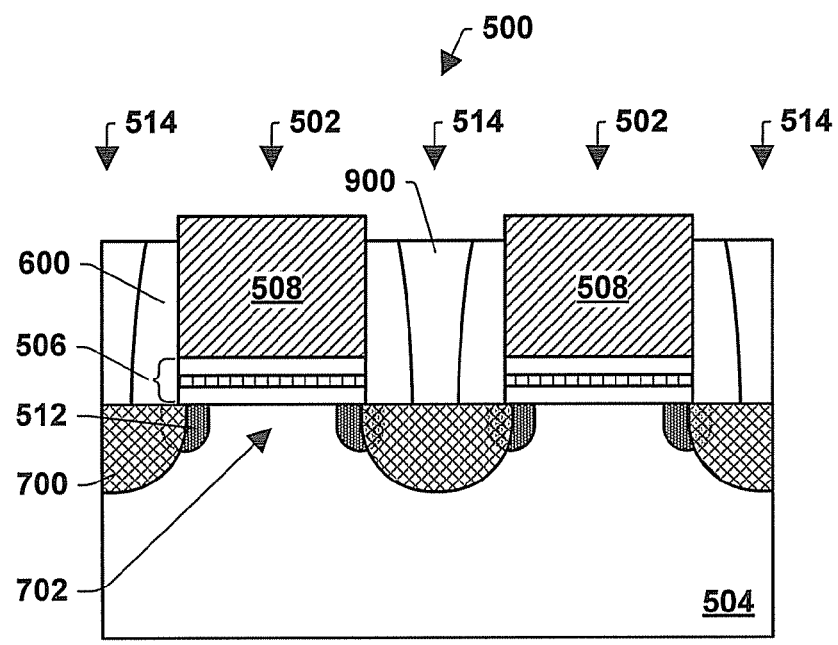

FIG. 9 illustrates removing the first mask layer 510 and removing an upper portion of the bit line dielectric layer 800, thereby forming a bit line dielectric 900 in the bit line opening 700. When the spacer 600 exists in the bit line opening, an upper portion of the spacer may or may not be removed. When the bit line dielectric layer 800 contains the same material as the spacer 600, the upper portions of the bit line dielectric layer 800 and spacer 600 can be removed at the same time.

The first mask layer 510 can be removed by any suitable technique. For example, when the first mask layer 510 contains nitride materials, the first mask layer 510 can be removed by contacting the first mask layer 510 with any suitable nitride etchant that does not substantially affect or damage the integrity of other layers in the memory device 500 such as the poly layer 508. Examples of nitride etchants include phosphoric acid. Other nitride etchants can also be used as long as they are capable of removing the first mask layer 510 selective to other layers.

The upper portion of the bit line dielectric layer 800 can be removed by any suitable technique. For example, the upper portion of the bit line dielectric layer is removed by chemical-mechanical polishing (CMP) and/or etching. For example, the upper portion of the bit line dielectric layer is polished by CMP under any suitable condition to facilitate removing/polishing the upper portion. The conditions generally depend upon, for example, the thickness of the bit line dielectric layer, the composition of the bit line dielectric layer, the desired implementations of the memory device 500 being fabricated, and the like.

The upper portion of the bit line dielectric layer 800 can be further removed by etching. For example, when the bit line dielectric layer 800 contains oxide materials, the upper portion of the bit line dielectric layer 800 can be removed by contacting the bit line dielectric layer 800 with any suitable oxide etchant that does not substantially affect or damage the integrity of other layers in the memory device 500 such as the poly layer 508. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. Other oxide etchants can also be used as long as they are capable of removing portions of the bit line dielectric layer 800 selective to other layers.

Any suitable amount of the upper portion of the bit line dielectric layer 800 can be removed. In one embodiment, the upper surface of the poly layer 508 is higher than the resultant upper surface of the bit line dielectric layer 800. In another embodiment, the upper surface of the poly layer 508 is substantially coplanar with the resultant upper surface of the bit line dielectric layer 800 (not shown). In yet another embodiment, the upper surface of the poly layer 508 is lower than the resultant upper surface of the bit line dielectric layer 800 (not shown). Because of the removal of the upper portion of the bit line dielectric layer, the upper surface of the poly layer 508 can be exposed.

Figure 10:
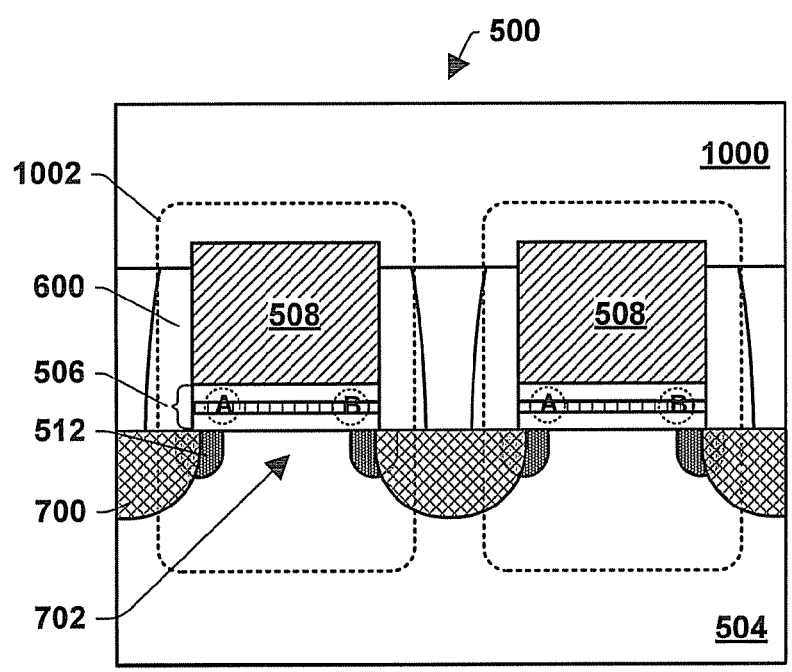

FIG. 10 illustrates forming a word line 1000 over the semiconductor substrate 504, thereby forming memory cells 1002 on the semiconductor substrate 504. The word line 1000 can contain any suitable conductive material such as polysilicon. The word line 1000 can be formed by, for example, forming a layer of word line material over the semiconductor substrate 504 and patterning (e.g., etching) the layer to establish the word line 1000 over the bit lines 700. The bit lines 700 and the word line 1000 can be oriented at substantially right angles relative to one another. When the spacers 600 are not removed and present in the bit line opening 700, the memory cells are offset by the spacers 600 and the bit line dielectrics 900.

The memory cell 1002 contains the charge trapping dielectric stack 506 on the semiconductor substrate 504 and the poly gate 508 on the charge trapping dielectric stack 506. The memory cell 1002 contains a pair of the bit lines 700 in the semiconductor substrate 504 adjacent the charge trapping dielectric stack 506 and under the bit line openings 514. The memory cells 1002 are separated by the bit line dielectrics 900 in the bit line openings 514.

The memory cell 1002 contains one or more charge storage nodes. The charge storage nodes can store at least a bit of information, respectively. For example, the memory cell 1002 is capable of storing two spatially separated binary data bits, including a left bit represented by the dashed circle A and a right bit represented by the dashed circle B. When the memory cell 1002 is such a dual-bit memory cell, the dual-bit memory cell is generally symmetrical, wherein a drain and a source are interchangeable, although asymmetric implementations are possible within the scope of the innovation. In the exemplary memory cell 1002, the left bit line 700 may serve as the source terminal and the right bit line 700 as the drain terminal with respect to the right bit. Likewise, the right bit line 700 may serve as the source terminal and the left bit line 700 as the drain terminal for the left bit.

The subject innovation may be implemented in association with various single or multi-bit memory cell types including a SONOS cell. In addition, the innovation is applicable to such dual-bit memory devices wherein both bits are used for data or information storage, as well as those in which only one bit (e.g., bit A or bit B) of the dual-bit cell is so used. Although not shown in Figures, the charge trapping dielectric stack contains a dielectric portion between the charge storage nodes, and the charge storage nodes are physically separated from each other.

Figure 11:
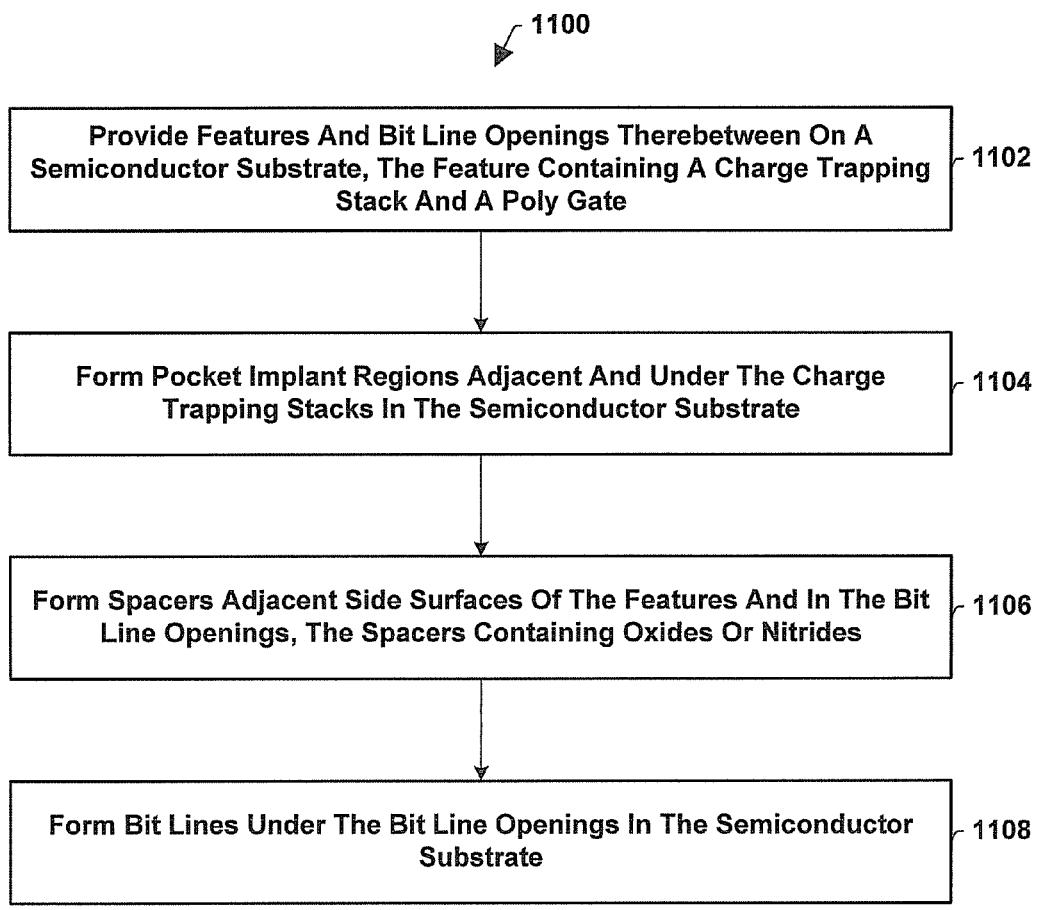
FIG. 11 is a flow diagram of an exemplary methodology of forming a memory device in accordance with an aspect of the subject innovation.

FIG. 11 illustrates an exemplary methodology 1100 of forming memory cells. At 1102, features are provided on a semiconductor substrate and bit line openings are provided between the features on the semiconductor substrate. The feature contains a charge trapping dielectric stack and a poly gate. At 1104, pocket implant regions are formed adjacent and under the charge trapping dielectric stack in the semiconductor substrate. At 1106, spacers are formed adjacent side surfaces of the features and in the bit line openings. The spacers contain oxides or nitrides. At 1108, bit lines are formed under the bit line openings in the semiconductor substrate.

Although not shown in FIG. 11, in one embodiment, the bit line is formed by implantation of one or more dopants using the spacers as an implant screen. The bit line can be formed so that a portion of the bit line overlaps with a portion of the pocket implant region. The spacers can be formed by a high temperature oxide formation process. The method can further involve forming bit line dielectrics in the bit line openings. In another embodiment, the method can further involve forming bit line dielectrics in the bit line openings with the proviso that the spacers are not removed from the bit line opening. The bit line dielectrics and the spacers can contain the same material (e.g., oxides or nitrides).

Figure 12:
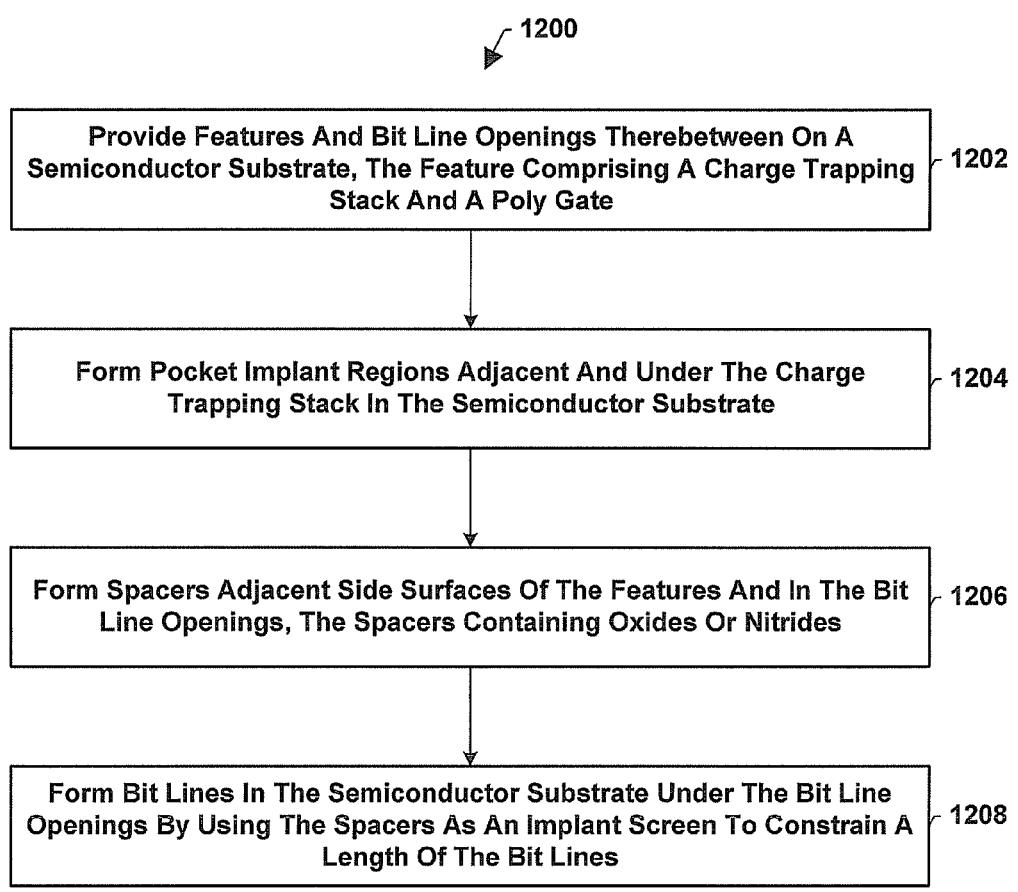
FIG. 12 is a flow diagram of an exemplary methodology of increasing an effective channel length in memory cells in accordance with an aspect of the subject innovation.

FIG. 12 illustrates an exemplary methodology 1200 of increasing an effective channel length in memory cells. At 1202, features are provided on a semiconductor substrate and bit line openings are provided between the features on the semiconductor substrate. The feature contains a charge trapping dielectric stack and a poly gate. At 1204, pocket implant regions are formed adjacent and under the charge trapping dielectric stack in the semiconductor substrate. At 1206, spacers are formed adjacent side surfaces of the features and in the bit line openings. The spacers contain oxides or nitrides. At 1208, bit lines are formed under the bit line openings in the semiconductor substrate by using the spacers as an implant screen to constrain a length of the bit lines.

Although not shown in FIG. 12, in one embodiment, the spacer is formed by a high temperature oxide formation process. In another embodiment, the length of the bit line is constrained so that an effective channel length is about 90% or more and about 100% or less of the length of the poly gate. In yet another embodiment, the bit line is formed so that a portion of the bit line overlaps with a portion of the pocket implant region. In still yet another embodiment, the method further involves forming bit line dielectrics in the bit line openings with the proviso that the spacers are not removed from the bit line openings.

Further, although not shown, the methodologies of FIGS. 11 and 12 may include any suitable memory device fabrication processes. General examples of memory device fabrication processes include masking, patterning, etching, planarization, cleaning, thermal oxidation, implant, annealing, thermal treatment, and deposition techniques normally used for making memory devices.

The resultant memory cell formed herein can be employed for central processing units (CPUs); volatile memory devices such as DRAM devices, SRAM devices, and the like; input/output devices (I/O chips); and non-volatile memory devices such as EEPROMs, EPROMs, PROMs, and the like.

The resultant memory cell formed herein is useful in any electronic device. For example, the resultant memory cell is useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject innovation. It is, of course, not possible to describe every conceivable combination of components or methodologies for purposes of describing the subject innovation, but one of ordinary skill in the art may recognize that many further combinations and permutations of the subject innovation are possible. Accordingly, the subject innovation is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

What is claimed is:

1. A dual-bit memory cell comprising:
   a charge trapping dielectric stack disposed overlying an essentially planar upper surface of a semiconductor substrate;
   a poly gate disposed overlying the charge trapping dielectric stack;
   p-type pocket implant regions having a first portion under a peripheral portion of the charge trapping dielectric stack and a second portion adjacent to the charge trapping dielectric stack and disposed in a bit line opening;
   spacers laterally adjacent the charge trapping dielectric stack and poly gate, wherein a first portion of each spacer overlies the second portion of each pocket implant region;
   a bit line implant region disposed in the semiconductor substrate adjacent the charge trapping dielectric stack and under the bit line opening wherein the bit line implant region has an upper surface congruent with the upper surface of the semiconductor surface; and
   a word line.

2. The dual-bit memory cell of claim 1, further comprising a bit line dielectric disposed over the bit line implant region.

3. The dual-bit memory cell of claim 1, wherein the charge trapping dielectric stack comprises two spatially separated charge storage nodes.

4. The dual-bit memory cell of claim 3, wherein the two spatially separated charge storage nodes are physically separated by a central dielectric disposed therebetween.

5. The dual-bit memory cell of claim 1, wherein the word line is disposed overlying the charge trapping dielectric stack.

6. The dual-bit memory cell of claim 1, wherein the charge trapping dielectric stack comprises at least one of silicon nitride, silicon oxynitride, silicon rich nitride and silicates, wherein each is characterized by having a dielectric constant higher than that of silicon dioxide ($SiO_2$).

7. The dual-bit memory cell of claim 5, wherein the charge trapping dielectric stack further comprises at least one oxide or nitride of Al, Ta, Hf, La, Zr, Ti, Nb, Cr, V, Y, Ce, and/or Pr.

8. The dual-bit memory cell of claim 1, wherein bit line length ($BL_L$) is 70% or more and 140% or less of the length of the bit line opening ($BLO_L$).

9. The dual-bit memory cell of claim 1, wherein the bit lines have a concentration of dopants of 5E17 atoms/$cm^3$ or more and 1E21 atoms/$cm^3$ or less.

10. The dual-bit memory cell of claim 1, wherein the bit lines have a depth of 20 nm or more and 300 nm or less.

11. A method of making dual-bit memory cells, comprising:
    forming a charge trapping dielectric stack disposed overlying an essentially planar upper surface of a semiconductor substrate;
    forming a poly gate disposed overlying the charge trapping dielectric stack;
    forming p-type pocket implant regions in the semiconductor substrate, wherein the p-type pocket implant regions have a first portion under a peripheral portion of the charge trapping dielectric stack, and a second portion adjacent to the charge trapping dielectric stack and disposed in a bit line opening;
    forming spacers laterally adjacent the charge trapping dielectric stack and the poly gate wherein a first portion of each spacer overlies the second portion of each pocket implant region;
    forming a bit line implant region disposed in the semiconductor substrate adjacent the charge trapping dielectric stack and under the bit line opening wherein the bit line implant region has an upper surface congruent with the upper surface of the semiconductor substrate;
    forming a word line overlying the charge trapping dielectric stack.

12. The method of claim 11 further comprising forming a bit line dielectric disposed over the bit line implant region in bit line opening.

13. The method of claim 11 further comprising forming two spatially separated charge storage nodes.

14. The method of claim 13, wherein forming two spatially separated charge storage nodes further comprises forming a central dielectric disposed between said two spatially separated charge storage nodes.

15. The method of claim 11, wherein forming pocket implant regions in the semiconductor substrate comprises implanting a dopant into the semiconductor substrate at an angle relative to an upper surface of the semiconductor substrate between 5 degrees and 40 degrees, inclusive.

16. A memory device, comprising:
an array of dual-bit memory cells, wherein each of the dual-bit memory cells comprises,
a charge trapping dielectric stack disposed overlying an essentially planar upper surface of a semiconductor substrate,
a poly gate disposed overlying the charge trapping dielectric stack,
p-type pocket implant regions having a first portion under a peripheral portion of the charge trapping dielectric stack and a second portion adjacent to the charge trapping dielectric stack and disposed in a bit line opening,
spacers laterally adjacent the charge trapping dielectric stack and poly gate, wherein a first portion of each spacer overlies the second portion of each pocket implant region,
a bit line implant region disposed in the semiconductor substrate adjacent the charge trapping dielectric stack and under the bit line opening wherein the bit line implant region has an upper surface congruent with the upper surface of the semiconductor surface, and
a word line;
wherein the array of dual-bit memory cells is arranged in rows and columns such that,
the charge trapping dielectric stack of each of the dual-bit memory cells includes one of the bit line openings and the bit line implant region disposed laterally adjacent on both sides,
two of the dual-bit memory cells in a same row and adjacent columns are separated by and share a common bit line opening and bit line implant region, and
the dual-bit memory cells in the same row share a common word line.

17. The memory device of claim 16 further comprising a bit line dielectric disposed over each of the bit line openings.

18. The memory device of claim 17, wherein the charge trapping dielectric stack of each of the dual-bit memory cells further comprises two spatially separated charge storage nodes.

19. The memory device of claim 17, wherein the two spatially separated charge storage nodes further comprise a central dielectric disposed therebetween.

* * * * *